United States Patent [19]

Barton

[11] Patent Number: 4,825,099
[45] Date of Patent: Apr. 25, 1989

[54] FEEDBACK-CONTROLLED CURRENT OUTPUT DRIVER HAVING REDUCED CURRENT SURGE

[75] Inventor: Steven K. Barton, Peyton, Colo.

[73] Assignee: Ford MicroElectronics, Colorado Springs, Colo.

[21] Appl. No.: 128,617

[22] Filed: Dec. 4, 1987

[51] Int. Cl.[4] ............... H03K 19/003; H03K 19/094; H03K 17/284; H03K 17/08

[52] U.S. Cl. ................... 307/270; 307/354; 307/500; 307/501; 307/585; 307/542; 307/296.8; 323/315; 330/288

[58] Field of Search ............ 307/270, 296.1, 296.3, 307/296.8, 443, 542, 544, 585, 576, 579, 310, 354, 496, 497, 499, 500, 501; 330/288; 323/312, 315, 316, 317

[56] References Cited

U.S. PATENT DOCUMENTS

| | | | |
|---|---|---|---|
| 4,574,233 | 3/1986 | Taylor | 323/315 X |
| 4,634,894 | 1/1987 | Shu et al. | 307/496 X |
| 4,697,154 | 9/1987 | Kousaka et al. | 330/288 X |
| 4,703,249 | 10/1987 | De La Plaza et al. | 323/316 |
| 4,717,845 | 1/1988 | Dunn | 307/270 X |
| 4,740,743 | 4/1988 | Reisinger et al. | 307/500 X |
| 4,745,395 | 5/1988 | Robinson | 307/270 X |
| 4,769,559 | 9/1988 | Mahabadi | 307/270 X |

Primary Examiner—Stanley D. Miller
Assistant Examiner—David R. Bertelson
Attorney, Agent, or Firm—Antonelli, Terry & Wands

[57] ABSTRACT

An output pad driver circuit for an integrated circuit chip architecture incorporates a controllably switched current mirror circuit in the circuit path between an output pad driver input terminal to which a digital signal produced by the signal processing circuitry of the chip is applied and an output terminal from which an output signal produced by the output pad is produced. The controllably switched current mirror circuit is coupled to a reference current terminal to which a source of reference current is applied. Coupled between the input terminal and the current mirror circuit is a first switching transistor which controllably causes the controllably switched current mirror circuit to apply a controlled current to the output terminal in response to a prescribed change in the logic level of an input signal that is applied to the input terminal. A second switching transistor is coupled in a feedback path between the output terminal and the current mirror circuit, and causes the current mirror circuit to terminate the supply of controlled current to the output terminal in response to the voltage level at said output terminal reaching a prescribed threshold. A third switching transistor is coupled between the input terminal and the current mirror circuit, so as to prevent the current mirror from applying a controlled current to the output terminal until the state of the input signal undergoes the prescribed logic level change.

19 Claims, 3 Drawing Sheets

FEEDBACK-CONTROLLED CURRENT OUTPUT DRIVER HAVING REDUCED CURRENT SURGE

FIELD OF THE INVENTION

The present invention relates in general to integrated circuits and is particularly directed to a current driver for driving an output pad of an integrated circuit chip with reduced surge current.

BACKGROUND OF THE INVENTION

Recent improvements in semiconductor processing technology (e.g. higher speed materials and reduced line widths) have made it possible to integrate increased complexity and higher speed circuit architectures in a semiconductor wafer or die of a given size. Such improved microelectronic hardware components, coupled with advances in signal processing capability of application software, have made it possible to physically house a greater number of signal processing devices within a given support structure and achieve a significantly enhanced operational performance. As a consequence, an ever increasing number of mechanical and electromechanical control systems (e.g. aircraft flight control and automotive engine and brake control systems) have been replaced by lightweight and reduced volume electronic units. In an environment where ambient conditions are subject to extreme fluctuations (which is certainly the case of vehicle control systems) circuit parameters may vary over a wide range, so that circuit design cannot be necessarily tailored to optimize performance criteria for all operating conditions. For example, active components of a circuit architecture inherently produce larger currents at the low end of the temperature range over which they operate.

In addition to variations in signal processing performance with changes in temperature, the actual physical configurations of the circuit layouts may introduce unwanted circuit characteristics which cause circuit components to operate erroneously. In particular, the conductive (e.g. metal) links used for power/ground feeds to components on the chip from power/ground pads, and to which pad driver circuits of the chip are connected, along the periphery of the chip, possess an inherent amount of unwanted resistance/inductance. The pad drivers which are powered by these links typically produce a peak capacitively loaded output current on the order of 50-100 ma. In a large complexity integrated circuit architecture, where a plurality of (e.g. twenty) circuit pins may change states effectively simultaneously, the total magnitude of the current variation among plural output pad drivers may exceed a peak of one ampere which, due to the non-insubstantial resistance of the power/ground link, may result in a voltage drop applied through a driver to an output pad that is sufficient to be mistaken by a load device as a momentary change in logic level, thereby causing misoperation of the system. This current surge problem is particularly pronounced at low temperature operation, where the magnitude of device currents are inherently larger, thereby increasing the peak values of current and voltage transients, and where external circuits may be faster and thus more sensitive to such a transient.

SUMMARY OF THE INVENTION

In accordance with the present invention, the above described current surge problem in an integrated circuit chip architecture, resulting from the substantial inherent resistance/inductance properties of the power/ground links, is significantly reduced by means of a new and improved output pad driver circuit which incorporates a controllably switched current mirror circuit. The switched current mirror circuit is disposed in the circuit path between an input terminal, to which a digital signal produced by the signal processing circuitry of the chip is applied, and an output terminal from which an output signal is produced. The controllably switched current mirror circuit is further coupled to a reference current terminal to which a source of reference current is applied by an on-chip reference supply. Coupled between the input terminal and the current mirror circuit is a first switching transistor which controllably causes the controllably switched current mirror circuit to apply a controlled current to the output terminal in response to a prescribed change in the logic level of an input signal that is applied to the input terminal. A second switching transistor is coupled in a feedback path between the current mirror circuit and the appropriate ground or power terminal, and causes the current mirror circuit to terminate the regulation of controlled current to the output terminal in response to the voltage level at said output terminal reaching a prescribed threshold. A third switching transistor is coupled between the input terminal and the current mirror circuit, so as to prevent the current mirror from applying a controlled current to the output terminal until the state of the input signal undergoes the prescribed logic level change.

By incorporating a switchably controlled current mirror circuit into the output driver, the current level at the output pad can be maintained at a value that effectively reduces the current level differential during a logic level transition that would otherwise occur were the output pad driven directly. By reducing this current level differential, what is seen by the output pad during a logic level transition is a 'slight' increase in current level, but not a change of a magnitude sufficient to cause a voltage drop that would be sensed by a connected circuit as an erroneous logic level. Because the operation of the current mirror is responsive to the voltage level at the output pad, the length of time that the current 'boost' is supplied to the output pad is accurately controlled to provide the surge compensation required.

DETAILED DESCRIPTION

Figure 1:
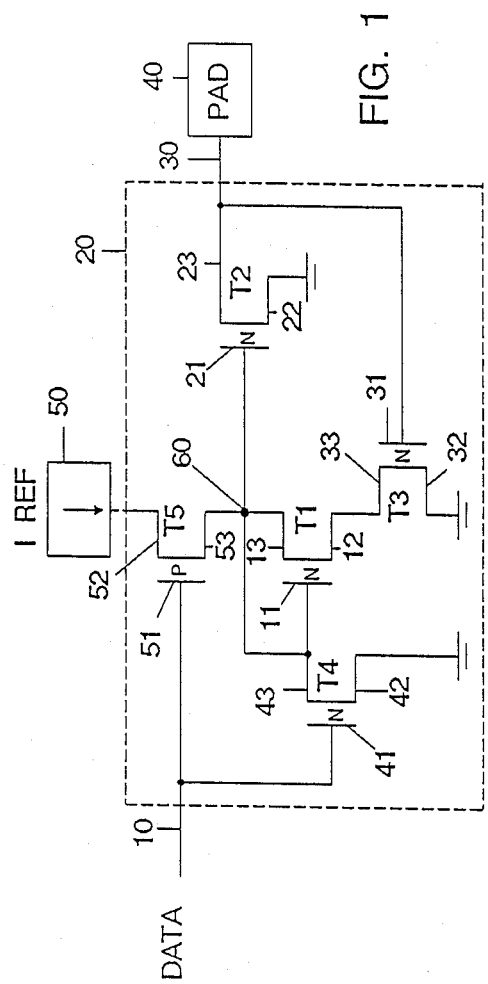
FIG. 1 is a schematic illustration of a controlled current output driver in accordance with an embodiment of the present invention.

Referring now to FIG. 1, a schematic diagram of the controlled current output driver in accordance with the present invention is illustrated. Specifically, an input line 10 over which a digital data signal (he state of which varies between respective high and low voltage levels) is coupled to a current driver, surrounded by broken lines 20, the output of which is coupled over a link 30 to an output pad (metallization) 40 on the chip. Also resident on the chip and coupled to driver 20 is a current source 50.

Within the current driver 20, input line 10 is coupled to the gate 51 of a P channel field effect switching transistor T5, the source 52 of which is coupled to current source 50 and the gate 53 of which is coupled to a node 60. Input line 10 is also coupled to the gate 41 of an N channel switching field effect transistor T4, the source 42 of which is coupled to a reference potential terminal (shown as ground) and the drain 43 of which is coupled to the gate 11 of a transistor T1 and to node 60.

Transistor T1, the drain 13 of which is coupled to node 60, and a transistor T2, the gate 21 of which is coupled to node 60, form a current mirror circuit for controlling the supply of current over output link 30 to pad 40. The source 22 of transistor T2 is coupled to a reference potential terminal (also shown as ground) while the drain 23 of transistor T2 is coupled to output line 30 to the pad 40. Line 30 is also coupled to the gate 31 of a feedback switching transistor T3, the source 32 of which is coupled to a reference potential terminal (ground) and the drain 33 of which is coupled to the source 12 of transistor T1.

In the configuration shown in FIG. 1, the ratio of current drive characteristics of transistors T2 and T1 is preestablished to provide a controlled drive current output from the drain 23 of transistor T2 over link 30 to pad 40 as a product of this ratio and the reference current supplied from current reference source 50. The supply of current from current source 50 to node 60 is controlled by the state of input data line 10 which controllably gates transistor T5. Switching transistor T4 controllably prevents the current mirror from driving output line 30 until the state of data link 10 is at a prescribed logic level. Switching transistor T3 monitors the voltage level on output link 30 to pad 40 and controllably disables the current mirror subsequent to its being rendered conductive by the logic level on input line 10, as will be described more fully below.

As noted above, the channel conductivity types of the field effect transistor switching elements of the driver circuit configuration shown in FIG. 1 are defined in accordance with a prescribed logic level polarity of the digital data signals applied over link 10. In the present example, the current driver is activated in response to a high to low logic level transition on data link 10.

Figure 2:
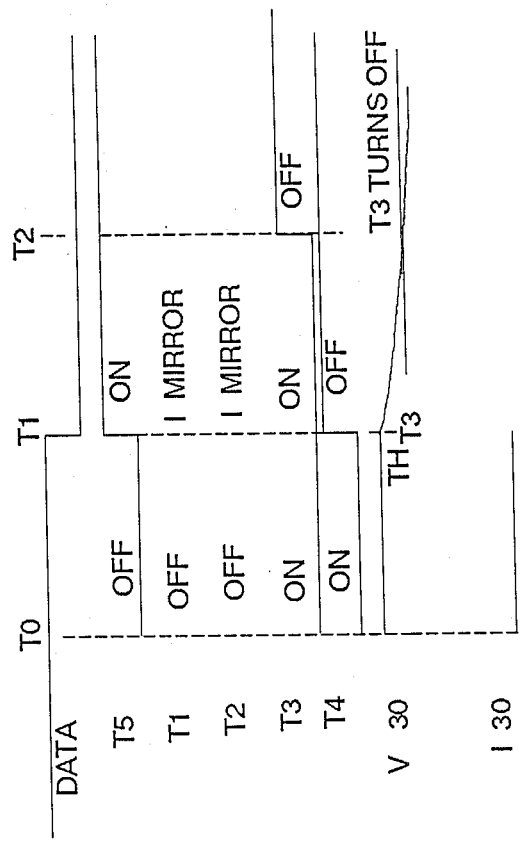
FIG. 2 illustrates a set of timing diagrams for explaining the operation of the output driver shown in FIG. 1.

More specifically, with reference to FIG. 2, which shows a set of timing diagrams for respective components of the current driver circuit configuration, shown in FIG. 1, let it be initially assumed that at some reference time T0, the logic level on input data line 10 is at a high state. As a consequence, P channel transistor T5, the gate 51 of which is coupled to link 10, will be gated off. Consequently, a current supply path from current reference source 50 to node 60 is interrupted. On the other hand, N channel switching transistor T4, the gate 41 of which is coupled to data link 10, is turned on by the high level on high link 10 so that a low logic level (ground) is coupled through the source drain path of transistor T4 through node 60 to the gate 21 of N channel transistor T2. Since a low logic level is applied to the gate 21 of N channel transistor T2, transistor T2 is gated off at this time.

Output pad 40, which is effectively equivalent to a capacitor coupled to ground, provides a voltage level over link 30 to gate 31 of N channel transistor T3, so that transistor T3 is turned on, coupling a low logic level (ground) over its source-drain path to the source-drain path of N channel transistor T1, which is turned off by the low logic level coupled to the source-drain path transistor T4.

When the logic level on data link 10 transitions from a high voltage level to a low voltage level, as shown at T1 in FIG. 2, P channel transistor T5 turns on, thereby coupling current reference source 50 to node 60. At the same time, N channel transistor T4 turns off, thereby interrupting the source-drain path of transistor T4 and interrupting the coupling of the low voltage level (ground) to the gate of each of transistors T1 and T2. As a consequence, transistors T1 and T2 now function as a current mirror circuit, applying a controlled output current over link 30 to the pad 40. The current applied to path 40 increases to a limiting value set by the multiplicative factor of the current mirror transistors T1 and T2 as shown in FIG. 2. During this time, the potential on link 30 is decreasing and eventually drops below the gating threshold of transistor T3. When this occurs, at time T2, transistors T3 turns off and the current level on output line 30 increases slightly from its level at time T2, and then drops to a DC load value, as shown in FIG. 2. With transistor T3 turned-off, there is a reduction in average power, since the operation of the current mirror is effectively terminated, the current mirror no longer conducting its reference current continuously. In addition, the magnitude of a low output is lower than the case when output transistor sizes are reduced. (Conversely, in a complementary circuit, a high output is higher.) Further, the circuit has improved stability with changes in processing and temperature and provides better static discharge protection than the case when the sizes of the output transistors are reduced.

As shown in the current timing diagram for link 30 in FIG. 2, a typical increase in current level supplied to the output pad 40 is a differential on the order of only 5 ma between the current mirror output value (e.g. on the order of 10 ma) and the spike value (e.g. on the order of 15 ma) as shown. This contrasts significantly from the normal action of an output driver which does not contain the switched current mirror in accordance with the present invention, which may result in a drive output current spike on the order of 110 ma, as shown by the dotted lines in the timing diagram for the current characteristic on output link 30 in FIG. 2. As a consequence, since the controlled current mirror driver output circuit significantly reduces the amplitude of the current spike at the time of a logic level transition, it is possible to use power bus links of reduced dimensions (and consequential increased resistance), thereby increasing the circuit integration density on the chip. In other words, the magnitudes of the voltage drops along the power buses no longer cause an erroneous misread problem because of the reduced current differential levels obtained in accordance with the present invention. Thus, not only can the integration density be increased, but the application of the chip to low temperature environments does not lead to erroneous operation. As pointed out above, it is an inherent characteristic of NMOS and CMOS integrated circuit devices that larger currents are produced at lower temperatures. However, the current driver in accordance with the present invention reduces the current differential so that the larger currents themselves are reduced, and do not contribute to a large IR drop across the power buses which might otherwise be misread as logic level changes.

Figure 3:
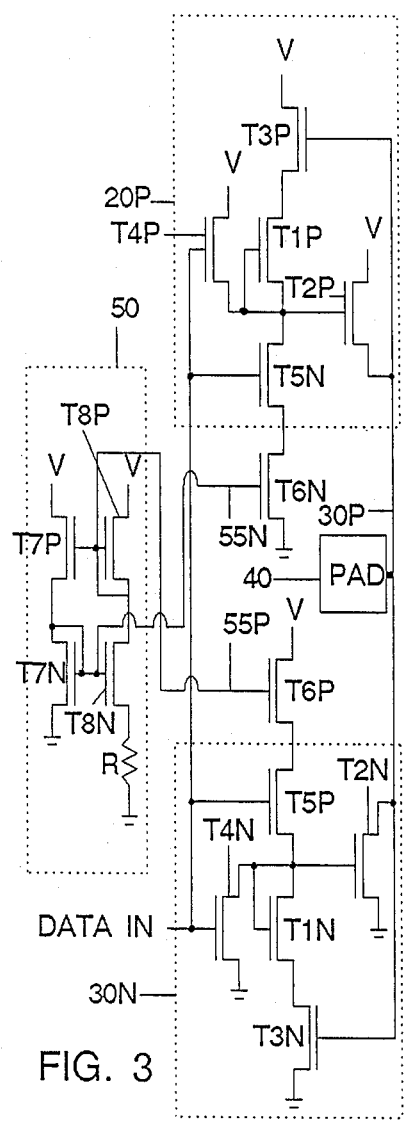
FIG. 3 is a schematic diagram of a controlled current output driver employing a complementary pair of the embodiments illustrated in FIG. 1, for providing surge compensation for dual polarity signals.

As pointed out above, the conductivity types of the field effect transistors which make-up the controlled current output driver shown in FIG. 1 provide current surge compensation for high to low transitions on data link 10. In a practical embodiment where current surge compensation is provided for logic level transitions for both polarities, a complementary driver pair coupled between data link 10 and output pad 40 is provided. A diagrammatic illustration of the invention employing complementary drivers for this purpose is illustrated in FIG. 3. As shown therein, the driver 20 of FIG. 1 is denoted by block 20N. A complementary channel conductivity version of this driver circuit is shown at block 20P, each complementary driver being coupled between data input line 10 and respective output links 30N and 30P to output pad 40. A conventional constant current reference source 50 is coupled over links 55P and 55N to respective switching transistors T6P and T6N.

As will be appreciated form the foregoing description of the present invention, the current surge problem in an integrated circuit chip architecture resulting from the substantial inherent resistance/inductance properties of the power/ground links is significantly reduced by means of a new and improved output pad driver circuit which incorporates a controllably switched current mirror circuit in the circuit path between an output pad driver input terminal to which a digital signal produced by the signal processing circuitry of the chip is applied and an output terminal from which an output signal produced by the output pad is produced. By incorporating a switchably controlled current mirror circuit into the output driver, the current level at the output pad can be maintained at a value that effectively reduces the current level differential during a logic level transition that would otherwise occur were the output pad driven directly. By reducing this current level differential, what is seen by the output pad during a logic level transition is a 'slight' increase in current level but not a change of a magnitude sufficient to cause a voltage drop that would be sensed by a connected circuit as an erroneous logic level. Because the operation of the current mirror is responsive to the voltage level at the output pad, the length of time that the current 'boost' is supplied to the output pad is accurately controlled to provide the surge compensation required.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A controlled current driver circuit comprising:
   an input terminal to which an input signal is applied;
   an output terminal from which an output signal is derived;
   a reference current terminal to which a source of reference current is applied;
   a current mirror circuit coupled between said reference current terminal and said output terminal;
   first means, coupled between said input terminal and said current mirror circuit, for causing said current mirror circuit to apply a controlled current to said output terminal in response to the application of an input signal to said input terminal; and
   second means, coupled between said output terminal and said current mirror circuit, for causing said current mirror circuit to terminate the supply of controlled current to said output terminal in response to the voltage level at said output terminal reaching a prescribed threshold.

2. A controlled current driver circuit according to claim 1, wherein said first means comprises first switching means, responsive to said input signal having a prescribed voltage level, for causing said source of reference current to be coupled to said current mirror circuit and second switching means for preventing said current mirror from applying said controlled current to said output terminal until said input signal reaches said prescribed voltage level.

3. A controlled current driver circuit according to claim 2, wherein said second means comprises third switching means, coupled between said output terminal and said current mirror circuit, for enabling said current mirror circuit to supply said controlled current to said output terminal in response to said source of reference current being coupled to said current mirror circuit by the operation of said first switching means, until the voltage level at said output terminal reaches said prescribed threshold.

4. A controlled current driver circuit according to claim 3, wherein said current mirror circuit comprises a first transistor having an input electrode, an output electrode and a control electrode, and a second transistor having an input electrode, an output electrode and a control electrode, the control and output electrodes of said first transistor being coupled to each of said first and second switching means and to the control electrode of said second transistor, the input electrode of said first transistor being coupled to said third switching means, the output electrode of said second transistor being coupled to said output terminal and the input electrode of said second transistor being coupled to a reference potential terminal.

5. A controlled current driver circuit according to claim 4, wherein said third switching means comprises a third transistor having an input electrode coupled to said reference potential terminal, an output electrode coupled to the input electrode of said first transistor and a control electrode coupled to said output terminal.

6. A controlled current driver circuit according to claim 5, wherein said second switching means comprises a fourth transistor having an input electrode coupled to said reference potential terminal, an output electrode coupled to the control electrode of said first and second transistors and a control electrode coupled to said input terminal 7. A controlled current driver circuit according to claim 6, wherein said first switching means comprises a fifth transistor having an input electrode coupled to receive said reference current, an output electrode coupled to the output electrode of said first transistor and the control electrode of said second transistor, and a control electrode coupled to said input terminal.

8. A controlled current driver circuit according to claim 3, wherein each of said current mirror circuit and said first, second and third switching means is comprised of field effect transistors.

9. A controlled current driver circuit according to claim 7, wherein each of said transistors is a field effect transistor.

10. A controlled current driver circuit comprising:

an input terminal to which an input signal, the state of which varies between first and second voltage levels, is applied;

an output terminal from which an output signal is derived;

a reference current terminal to which a source of reference current is applied;

a current mirror circuit coupled between said reference current terminal and said output terminal;

first means, coupled between said input terminal and said current mirror circuit, for causing said current mirror circuit to apply a controlled current to said output terminal in response to the state of said input signal being at said first voltage level; and second means, coupled between said output terminal and said current mirror circuit, for causing said current mirror circuit to terminate the supply of controlled current to said output terminal in response to the voltage level at said output terminal reaching a prescribed threshold.

11. A controlled current driver circuit according to claim 10, wherein said first means comprises first switching means, responsive to the state of said input signal being at said first voltage level, for causing said source of reference current to be coupled to said current mirror circuit, and second switching means for preventing said current mirror from applying said controlled current to said output terminal until the state of said input signal reaches said first voltage level.

12. A controlled current driver circuit according to claim 11, wherein said second means comprises third switching means, coupled between said output terminal and said current mirror circuit, for enabling said current mirror circuit to supply said controlled current to said output terminal in response to said source of reference current being coupled to said current mirror circuit by the operation of said first switching means, until the voltage level at said output terminal reaches said prescribed threshold.

13. A controlled current driver circuit according to claim 12, wherein said current mirror circuit comprises a first transistor having an input electrode, an output electrode and a control electrode, and a second transistor having an input electrode, an output electrode and a control electrode, the control and output electrodes of said first transistor being coupled to each of said first and second switching means and to the control electrode of said second transistor, the input electrode of said first transistor being coupled t said third switching means, the output electrode of said second transistor being coupled to said output terminal and the input electrode of said second transistor being coupled to a reference potential terminal.

14. A controlled current driver circuit according to claim 13, wherein said third switching means comprises a third transistor having an input electrode coupled to said reference potential terminal, an output electrode coupled to the input electrode of said first transistor and a control electrode coupled to said output terminal.

15. A controlled current driver circuit according to claim 14, wherein said second switching means comprises a fourth transistor having an input electrode coupled to said reference potential terminal, an output electrode coupled to the control electrode of said first and second transistors and a control electrode coupled to said input terminal.

16. A controlled current driver circuit according to claim 15, wherein said first switching means comprises a fifth transistor having an input electrode coupled to receive said reference current, an output electrode coupled to the output electrode of said first transistor and the control electrode of said second transistor, and a control electrode coupled to said input terminal.

17. A controlled current driver circuit according to claim 12, wherein each of said current mirror circuit and said first, second and third switching means is comprised of field effect transistors.

18. A controlled current driver circuit according to claim 16, wherein each of said transistors is a field effect transistor.

19. A controlled current driver comprising:

an input terminal to which an input signal, the state of which varies between first and second voltage levels, is applied;

an output terminal from which an output signal is derived; and a pair of complementary output current driver circuits coupled between said input terminal and said output terminal, each of which comprises a reference current terminal to which a source of reference current is applied, a current mirror circuit coupled between said reference current terminal and said output terminal, first means, coupled between said input terminal and said current mirror circuit, for causing said current mirror circuit to apply a controlled current to said output terminal in response to the state of said input signal being at said first voltage level, and second means, coupled between said output terminal and said current mirror circuit, for causing said current mirror circuit to terminate the supply of controlled current to said output terminal in response to the voltage level at said output terminal reaching a prescribed threshold.

* * * * *